United States Patent
Hwang et al.

(10) Patent No.: US 9,960,770 B2
(45) Date of Patent: May 1, 2018

(54) SEMICONDUCTOR INTEGRATED CIRCUIT DEVICE REGARDING THE DETECTION OF DEGRADATION

(71) Applicant: SK hynix Inc., Icheon-si, Gyeonggi-do (KR)

(72) Inventors: Jeong Tae Hwang, Icheon-si (KR); Jin Youp Cha, Icheon-si (KR); Young Sik Heo, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/040,817

(22) Filed: Feb. 10, 2016

(65) Prior Publication Data

US 2016/0226493 A1    Aug. 4, 2016

Related U.S. Application Data

(63) Continuation-in-part of application No. 14/723,833, filed on May 28, 2015, now Pat. No. 9,429,618.

(30) Foreign Application Priority Data

Jan. 30, 2015   (KR) .................. 10-2015-0015408

(51) Int. Cl.
*H03K 19/0185*    (2006.01)
*G01R 31/28*      (2006.01)
*H03K 17/10*      (2006.01)

(52) U.S. Cl.
CPC . *H03K 19/018521* (2013.01); *G01R 31/2856* (2013.01); *H03K 17/102* (2013.01)

(58) Field of Classification Search
CPC ......... H03K 19/018521; H03K 17/102; G01R 31/2621; G01R 31/2824; G01R 31/2856; G01R 31/2858

(Continued)

(56) References Cited

U.S. PATENT DOCUMENTS 6,157,216 A    12/2000  Lattimore et al.
6,476,632 B1 * 11/2002  La Rosa ............ G01R 31/2824
                                                   324/762.05

(Continued)

FOREIGN PATENT DOCUMENTS

KR    1020000056020 A    9/2000
WO       2007036020 A1   4/2007

*Primary Examiner* — Lincoln Donovan
*Assistant Examiner* — Colleen O Toole
(74) *Attorney, Agent, or Firm* — William Park & Associates Ltd.

(57) ABSTRACT

A semiconductor integrated circuit device may include a target PMOS transistor, a target NMOS transistor, a first stress-applying circuit, a second stress-applying circuit, a third stress-applying circuit and a fourth stress-applying circuit. An inverter may include the target PMOS transistor and the NMOS transistor. The first stress-applying circuit may be configured to apply a first DC level to a gate of the target PMOS transistor. The second stress-applying circuit may be configured to apply a second DC level to a gate of the target NMOS transistor. The third stress-applying circuit may be configured to apply an AC voltage shape to the gate of the target NMOS transistor. The fourth stress-applying circuit may be configured to apply the AC voltage to a drain of the target NMOS transistor.

19 Claims, 4 Drawing Sheets

(58) Field of Classification Search
USPC .............................. 324/537, 762.09; 702/117
See application file for complete search history.

(56) References Cited

U.S. PATENT DOCUMENTS

| | | | |
|---|---|---|---|
| 8,456,247 B2* | 6/2013 | Kim | H03K 3/0315 331/176 |
| 8,676,516 B2* | 3/2014 | Gebara | G01R 31/31725 702/42 |
| 8,786,307 B2 | 7/2014 | Jain | |
| 2009/0267634 A1* | 10/2009 | Nada | G01R 31/2628 324/762.09 |
| 2010/0318313 A1 | 12/2010 | Agarwal et al. | |
| 2011/0199837 A1 | 8/2011 | Reohr et al. | |

* cited by examiner

SEMICONDUCTOR INTEGRATED CIRCUIT DEVICE REGARDING THE DETECTION OF DEGRADATION

CROSS-REFERENCES TO RELATED APPLICATION

This application is a continuation-in-part of application Ser. No. 14/723,833, filed May 28, 2015, titled "SEMICONDUCTOR INTEGRATED CIRCUIT DEVICE HAVING FUNCTION FOR DETECTING DEGRADATION OF SEMICONDUCTOR DEVICE AND METHOD OF DRIVING THE SAME".

BACKGROUND

1. Technical Field

Various embodiments generally relate to a semiconductor integrated circuit device, more particularly, to a semiconductor integrated circuit device regarding the detection of degradation.

2. Related Art

When a high electric field is applied to gates of PMOS transistors in a semiconductor memory device for a long time, a negative bias used in the semiconductor memory device may be destabilized in accordance with a change in temperature. This may be referred to as negative bias temperature instability (NBTI). The NBTI may cause a threshold voltage of a PMOS transistor to increase. This increase may cause the capacity of the semiconductor memory device to deteriorate.

How much the PMOS transistor has degraded may be obtained by applying a voltage to a gate of an inverter that includes the PMOS transistor and an NMOS transistor. Then a voltage outputted from the inverter may be measured to obtain if the PMOS transistor has been degraded.

However, the output voltage from the inverter may indicate degradation of the NMOS transistor as well as a degradation of the PMOS transistor. Thus, it may be required to separately measure the degradation pertaining to the PMOS transistor and the degradation pertaining to the NMOS transistor.

Further, a large amount of stress may be induced on the NMOS transistor caused by an alternate current (AC) voltage. Thus, it may be required to check the amount of stress caused by a direct current (DC) voltage and the AC voltage.

SUMMARY

Figure 1:
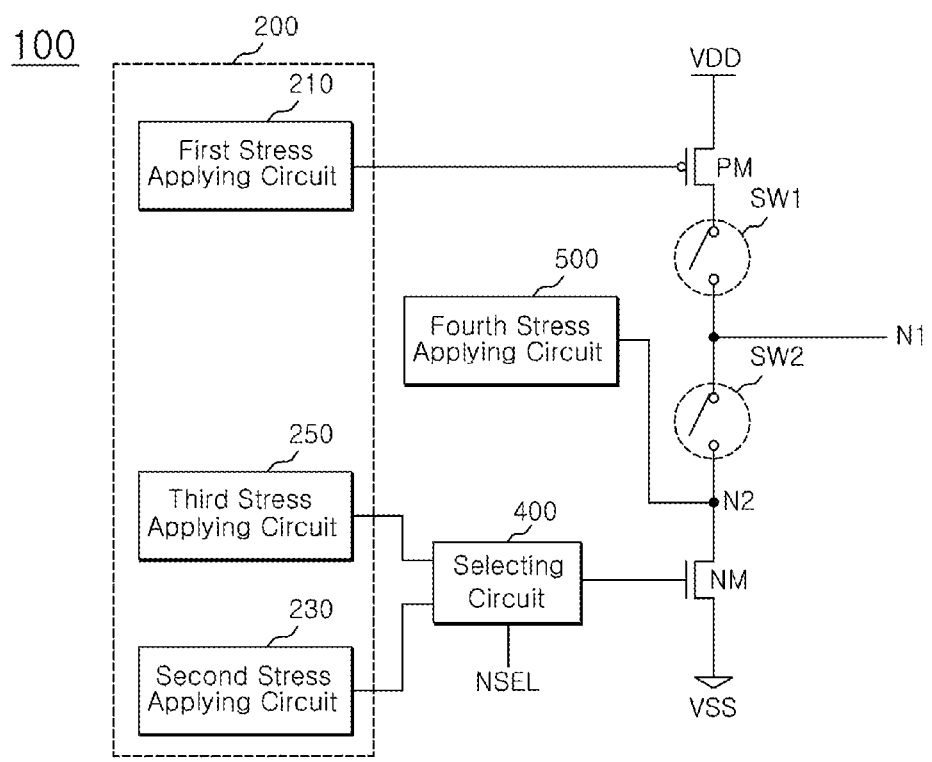
FIG. 1 is a block diagram illustrating a representation of a semiconductor integrated circuit device having a degradation detection function in accordance with examples of embodiments.

According to an embodiment, there may be provided a semiconductor integrated circuit device. The semiconductor integrated circuit device may include a target PMOS transistor, a target NMOS transistor, a first stress-applying circuit, a second stress-applying circuit, a third stress-applying circuit and a fourth stress-applying circuit. An inverter may include the target PMOS transistor and the NMOS transistor. The first stress-applying circuit may be configured to apply a first DC level to a gate of the target PMOS transistor. The second stress-applying circuit may be configured to apply a second DC level to a gate of the target NMOS transistor. The third stress-applying circuit may be configured to apply an AC voltage shape to the gate of the target NMOS transistor. The fourth stress-applying circuit may be configured to apply the AC voltage to a drain of the target NMOS transistor.

According to an embodiment, there may be provided a semiconductor integrated circuit device. The semiconductor integrated circuit device may include a target NMOS transistor configured to test a degradation of the semiconductor integrated circuit device due to a stress. The semiconductor integrated circuit device may include a gate stress-applying circuit configured to selectively apply a direct current (DC) voltage having a first level, a DC voltage having a second level different from the first level and an alternate current (AC) voltage to a gate of the target NMOS transistor. The semiconductor integrated circuit device may include an auxiliary stress-applying circuit configured to apply a voltage to a drain of the target NMOS transistor when the AC voltage is applied to the gate of the target NMOS transistor, the voltage having a waveform substantially the same as that of the AC voltage.

According to an embodiment, there may be provided a semiconductor integrated circuit device. The semiconductor integrated circuit device may include a target PMOS transistor and a target NMOS transistor coupled to the target PMOS transistor. The semiconductor integrated circuit device may include a gate stress-applying circuit coupled to gates of the target PMOS transistor and the target NMOS transistor and configured to apply a ring oscillator stress to the gate and a drain of the target NMOS transistor to measure a hot carrier injection (HCI) stress influence.

DETAILED DESCRIPTION

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey the scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

Various embodiments generally relate to a semiconductor integrated circuit device, more particularly, to a semiconductor integrated circuit device regarding to the detection of a degradation of a semiconductor device due to a stress.

FIG. 1 is a block diagram illustrating a representation of a semiconductor integrated circuit device having a degradation detection function in accordance with examples of embodiments.

Referring to FIG. 1, a semiconductor integrated circuit device 100 in an example of an embodiment may include an inverter including a target PMOS transistor PM and a target NMOS transistor NM, a first switching circuit SW1, a second switching circuit SW2, a gate stress-applying circuit 200, a selecting circuit 400 and an auxiliary stress-applying circuit.

The first switching circuit SW1 may be connected between the target PMOS transistor PM and an output node N1 of the inverter. The second switching circuit SW2 may be connected between the output node N1 and the target NMOS transistor NM. The first switching circuit SW1 and the second switching circuit SW2 may allow for individually measuring a current flowing through the target PMOS transistor PM and a current flowing through the target NMOS transistor NM.

The gate stress-applying circuit 200 may include a first stress-applying circuit 210, a second stress-applying circuit 230 and a third stress-applying circuit 250.

The first stress-applying circuit 210 may correspond to a DC voltage source for applying a voltage to a gate of the target PMOS transistor PM.

The second stress-applying circuit 230 may correspond to a DC voltage source for applying a voltage to a gate of the target NMOS transistor NM.

The third stress-applying circuit 250 may correspond to an AC voltage source for applying a voltage to the gate of the target NMOS transistor NM.

The selecting circuit 400 may select any one of output voltages from the second stress-applying circuit 230 and the third stress-applying circuit 250 in response to a target NMOS transistor selection signal NSEL. The selecting circuit 400 may provide the selected output voltage to the target NMOS transistor NM.

The auxiliary stress-applying circuit may correspond to a fourth stress-applying circuit 500. The fourth stress-applying circuit 500 may be connected between the second switching circuit SW2 and a drain node N2 of the target NMOS transistor NM. The fourth stress-applying circuit 500 may correspond to a drain stress-applying circuit configured to apply an AC voltage to the drain node N2 of the target NMOS transistor NM in a stress-applying mode.

Figure 2:
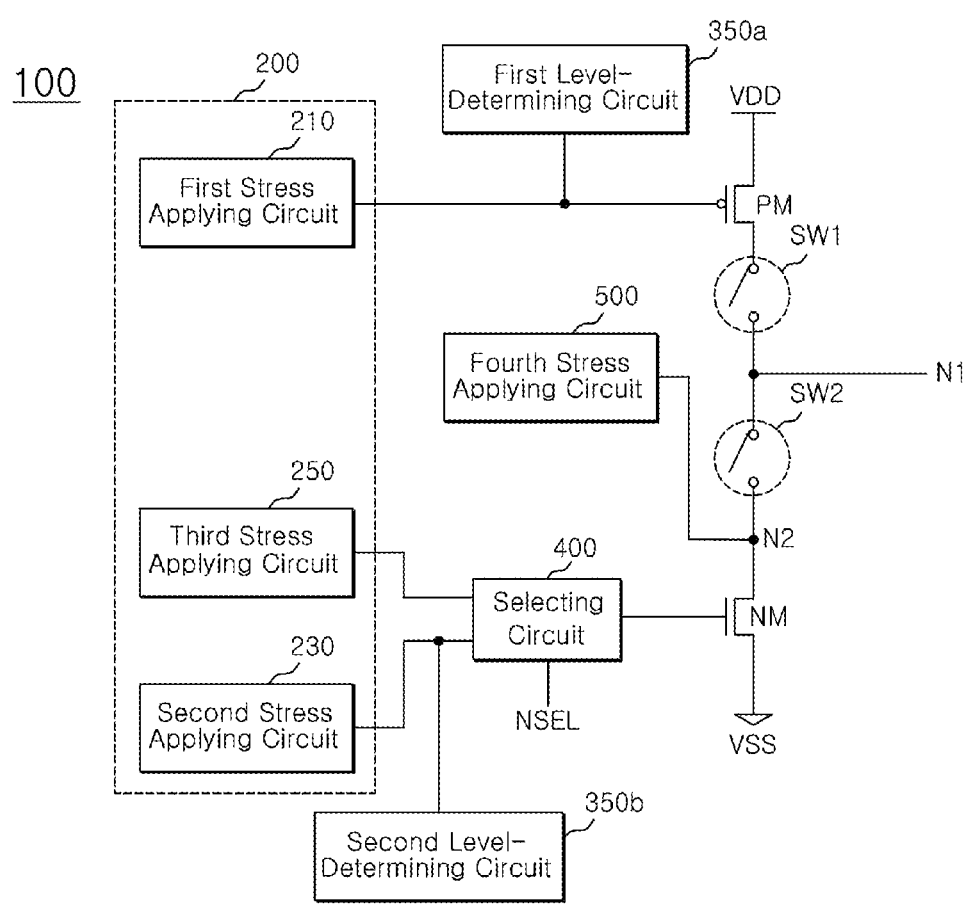
FIG. 2 is a block diagram illustrating a representation of a semiconductor integrated circuit device having a degradation detection function in accordance with examples of embodiments.

FIG. 2 is a block diagram illustrating a representation of a semiconductor integrated circuit device having a degradation detection function in accordance with examples of embodiments.

Referring to FIG. 2, a first level-determining circuit 350a may be connected between the first stress-applying circuit 210 and the gate of the target PMOS transistor PM. The first level-determining circuit 350a may be configured to determine an initial driving level of the target PMOS transistor PM. A second level-determining circuit 350b may be connected between the second stress-applying circuit 230 and the selecting circuit 400. The second level-determining circuit 350b may be configured to determine an initial driving level of the target NMOS transistor NM.

Since components except the first and second level-determining circuits 350a and 350b may be configured and operate in substantially the same manner as the components of FIG. 1, detailed descriptions thereof will be omitted herein.

Figure 3:
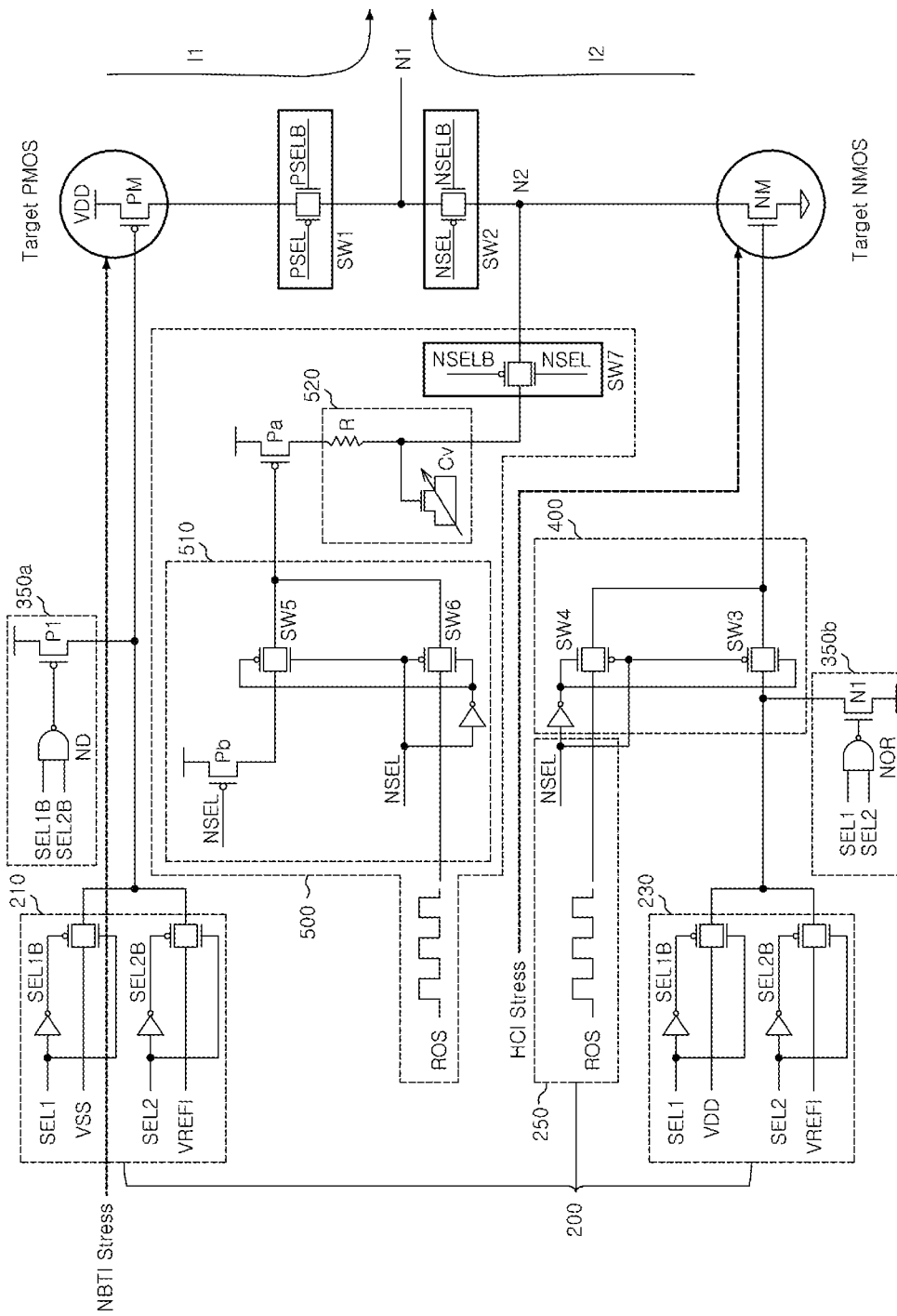
FIG. 3 is a circuit diagram illustrating a representation of a semiconductor integrated circuit device having a degradation detection function in accordance with examples of embodiments.

FIG. 3 is a circuit diagram illustrating a representation of a semiconductor integrated circuit device having a degradation detection function in accordance with examples of embodiments.

Referring to FIG. 3, the first switching circuit SW1 connected between the target PMOS transistor PM and the output node N1 of the inverter may correspond to a transfer gate configured to be selectively turned-on in response to a PMOS selection signal PSEL and PSELB.

The second switching circuit SW2 connected between the output node N1 of the inverter and the target NMOS transistor NM may correspond to a transfer gate configured to be selectively turned-on in response to an NMOS selection signal NSEL and NSELB.

The first stress-applying circuit 210 may selectively output a ground voltage VSS or an internal voltage VREFI. The output voltage from the first stress-applying circuit 210 may be provided to the gate of the target PMOS transistor PM.

For example, when a first selection signal SEL1 may be enabled, the ground voltage VSS may be provided to the target PMOS transistor PM as a gate voltage. When a second selection signal SEL2 may be enabled, the internal voltage VREFI may be provided to the target PMOS transistor PM as a gate voltage.

The second stress-applying circuit 230 may selectively output an external voltage VDD or an internal voltage VREFI. The output voltage from the second stress-applying circuit 230 may be provided to the gate of the target NMOS transistor NM. For example, when the first selection signal SEL1 may be enabled, the external voltage VDD may be provided to the target NMOS transistor NM as a gate voltage. When the second selection signal SEL2 may be enabled, the internal voltage VREFI may be provided to the target NMOS transistor NM as a gate voltage.

The third stress-applying circuit 250 may correspond to a ring oscillator stress (ROS) generating circuit having an AC voltage shape.

The PMOS transistor may receive the NBTI stress due to a high level of a DC voltage. The NMOS transistor may receive the NBTI stress and a hot carrier injection (HCI) stress due to a DC voltage.

In order to individually apply and monitor the stresses caused by the NBTI and the HCI to the target NMOS transistor NM, the semiconductor integrated circuit device of an example of an embodiment may include the second stress-applying circuit 230 configured to provide the DC voltage and the third stress-applying circuit 250 configured to provide the AC voltage.

The selecting circuit 400 may apply the output signal from the second stress-applying circuit 230 or the third stress-applying circuit 250 to the target NMOS transistor NM as a gate voltage in response to the NMOS selection signal NSEL. The selecting circuit 400 may include a third switching circuit SW3 and a fourth switching circuit SW4 driven in response to the NMOS selection signal NSEL. For example, when the NMOS selection signal NSEL is at a high level, the fourth switching circuit SW4 may be turned-on so that the AC shape of the ring oscillator stress (ROS) may be provided to the gate of the target NMOS transistor NM. For example, when the NMOS selection signal NSEL is at a low level, the third switching circuit SW3 may be turned-on so that the output signal from the DC shape of the second stress-applying circuit 230 may be provided to the gate of the target NMOS transistor NM.

The fourth stress-applying circuit 500 may be configured to change a drain voltage of the target NMOS transistor NM. The HCI stress may be maximized when the AC voltage may be applied to the gate of the NMOS transistor and a high level may be applied to the drain voltage. Thus, the fourth stress-applying circuit 500 may be configured to apply the AC voltage to the drain of the target NMOS transistor NM under a condition that the output signal from the third stress-applying circuit 250 may be provided to the gate of the target NMOS transistor NM.

The fourth stress-applying circuit 500 may include an AC voltage-applying circuit 510, an AC-PMOS transistor Pa and an AC-switching circuit SW7.

The AC voltage-applying circuit 510 may apply the ROS to the AC-PMOS transistor Pa in response to the NMOS selection signal NSEL. The AC voltage-applying circuit 510 may include a PMOS transistor Pb, a fifth switching circuit SW5 and a sixth switching circuit SW6. The PMOS transistor Pb, the fifth switching circuit SW5 and the sixth switching circuit SW6 may be driven in response to the NMOS selection signal NSEL. The AC voltage-applying circuit 510 may be configured to selectively provide a disable signal or the ROS to the AC-PMOS transistor Pa in response to the NMOS selection signal NSEL. For example, the AC-PMOS transistor Pa may be turned-off in a normal mode.

The AC voltage-applying circuit 510 may output a signal substantially the same as output signals from the third stress-applying circuit 250 and the selecting circuit 400. Thus, the AC-PMOS transistor Pa and the target NMOS transistor NM may receive the AC voltage (ROS) having the same level.

The AC-switching circuit SW7 may be driven in response to the NMOS selection signal NSEL. The AC-switching circuit SW7 may apply the output signal from the AC-PMOS transistor Pa to the drain of the target NMOS transistor NM. A quasi inverter may include the AC-PMOS transistor Pa and the target NMOS transistor NM. A reference numeral N2 may indicate an output node of the quasi inverter, that is a drain node of the target transistor NM.

An RC delay 520 may be connected between the AC-PMOS transistor Pa and the AC-switching circuit SW7. A capacitor in the RC delay 520 may correspond to a variable capacitor Cv. An output signal level of the quasi inverter may be changed by controlling the variable capacitor Cv. Therefore, influences due to the stress may be accurately detected. The RC delay 520 may also include a resistor R coupled between a drain of the AC-PMOS transistor and the variable capacitor Cv.

The first level-determining circuit 350a may include a logic gate, for example, a NAND gate ND. The first level-determining circuit 350a may include a PMOS transistor P1. The NAND gate ND may receive an inverted first selection signal SEL1B and an inverted second selection signal SEL2B. The NAND gate ND may process the inverted first selection signal SEL1B and the inverted second selection signal SEL2B. An output signal from the NAND gate NA may be inputted into the gate of the PMOS transistor P1. For example, when the ground voltage VSS and the internal voltage VREFI are not supplied in the normal mode, the first level-determining circuit 350a may provide a high level of the voltage to the gate of the target PMOS transistor PM to turn-off the target PMOS transistor PM.

The second level-determining circuit 350b may include a logic gate, for example, a NOR gate NOR. The second level-determining circuit 350b may include an NMOS transistor N1. The NOR gate NOR may receive a first selection signal SEL1 and a second selection signal SEL2. The NOR gate NOR may process the first selection signal SEL1 and the second selection signal SEL2. An output signal from the NOR gate NOR may be inputted into the gate of the NMOS transistor N1. For example, when the ground voltage VSS and the internal voltage VREFI are not supplied in the normal mode, the second level-determining circuit 350b may provide a low level of the voltage to the gate of the target NMOS transistor NM to turn-off the target NMOS transistor NM.

Hereinafter, examples of operations of the semiconductor integrated circuit device are discussed below.

In the normal mode, when the first level-determining circuit 350a and the second level-determining circuit 350b are driven, a disable signal may be inputted into the gates of the target PMOS transistor PM and the target NMOS transistor NM in the inverter. Thus, when the semiconductor memory device is normally operated, the target PMOS transistor PM and the target NMOS transistor NM may not be driven.

In order to detect the degradation of the semiconductor integrated circuit device by applying the stress, when the first selection signal SEL1 is at the high level and the second selection signal SEL2 is at a low level, the ground voltage VSS may be provided to the gate of the target PMOS transistor PM and the external voltage VDD may be provided to the gate of the target NMOS transistor NM. Thus, the target PMOS transistor PM and the target NMOS transistor NM may receive the stress having the DC voltage level corresponding to the ground voltage VSS and the external voltage VDD.

After the ground voltage VSS as the gate voltage is applied to the target PMOS transistor PM, the target PMOS transistor PM may be turned-off. The first switching circuit SW1 may be closed by the PMOS selection signal PSEL and PSELB. The second switching circuit SW2 may be opened by the NMOS selection signal NSEL and NSELB. A leakage current I1 between the source of the target PMOS transistor PM and the output node N1. The NBTI stress influence of the target PMOS transistor PM due to the ground voltage VSS may be monitored based on the measured leakage current I1.

After the external voltage VDD as the gate voltage is applied to the target NMOS transistor NM, the target NMOS transistor NM may be turned-off. The first switching circuit SW1 may be opened by the PMOS selection signal PSEL and PSELB. The second switching circuit SW2 may be closed by the NMOS selection signal NSEL and NSELB. A leakage current I2 between the output node N1 and the source of the target NMOS transistor NM. The NBTI stress influence of the target NMOS transistor NM due to the external voltage VDD may be monitored based on the measured leakage current I2.

When the first selection signal SEL1 is at the low level and the second selection signal SEL2 is at the high level, the internal voltage VREFI may be provided to the gates of the target PMOS transistor PM and the target NMOS transistor NM. Thus, the target PMOS transistor PM and the target NMOS transistor Nm may receive the stress due to the internal voltage VREFI.

The NBTI stress influence of the target PMOS transistor PM and the target NMOS transistor NM may be monitored by measuring leakage currents of the target PMOS transistor PM and the target NMOS transistor NM from driving of the first and second switching circuits SW1 and SW2.

The selecting circuit 400 may provide the voltages VDD and VREFI having the DC level or the ROS from the third stress-applying circuit 250 to the gate of the target NMOS transistor NM in accordance with enablement of the NMOS selection signal NSEL.

For example, when the NMOS selection signal NSEL may be enabled to the high level, the selecting circuit 400 may provide the ROS to the gate of the target NMOS transistor NM. The AC voltage-applying circuit 510 may provide the ROS to the gate of the AC-PMOS transistor Pa. Thus, because the ROS may be simultaneously inputted into the gate and the drain of the target NMOS transistor NM, the high HCI stress may be applied to the target NMOS transistor NM.

Figure 4:
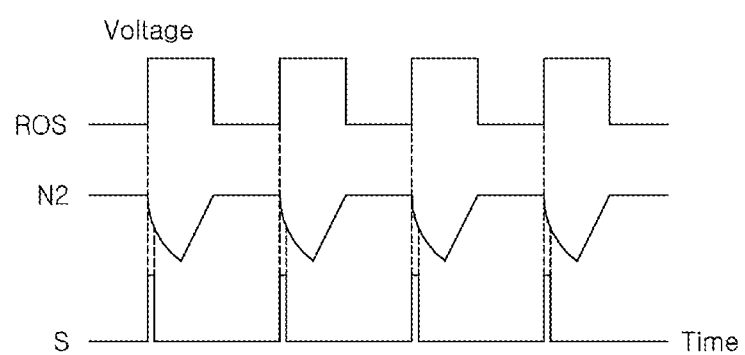
FIG. 4 is a timing chart illustrating representations of operations of a fourth stress-applying circuit in accordance with examples of embodiments.

Referring to FIG. 4, the ROS may be applied to the gates of the AC-PMOS transistor Pa and the target NMOS transistor NM in the quasi inverter. Because the drain node N2 of the target NMOS transistor NM may correspond to an output node of the quasi inverter, the inverted ROS may be outputted from the drain node N2 of the target NMOS transistor NM. A voltage of the drain node N2 may have a triangular wave by controlling a capacitance of the RC delay 520.

The degradation S due to the HCI stress may be obtained by a logical operation of the ROS and the drain node voltage N2. A peak value of the degradation S may be changed by controlling the RC delay 520. The HCI stress may be measured based on a pulse width representing the degradation S.

According to an example of an embodiment, the ROS having the same level may be applied to the gate and the drain of the target NMOS transistor so that the HCI stress influence may be accurately measured.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor integrated circuit device comprising:
    an inverter including a target PMOS transistor coupled to a target NMOS transistor;
    a first stress-applying circuit configured to apply a first direct current (DC) level to a gate of the target PMOS transistor;
    a second stress-applying circuit configured to apply a second DC level to a gate of the target NMOS transistor;
    a third stress-applying circuit configured to apply an alternating current (AC) voltage to the gate of the target NMOS transistor in response to a target NMOS selection signal; and
    a fourth stress-applying circuit configured to apply the AC voltage to a drain of the target NMOS transistor, when the alternating current voltage is applied to the gate of the target NMOS transistor, in response to the target NMOS selection signal,
    wherein the fourth stress-applying circuit includes an RC delay.

2. The semiconductor integrated circuit device of claim 1, further comprising:
    a plurality of switches configured to individually generate a first current path in the target PMOS transistor and a second current path in the target NMOS transistor.

3. The semiconductor integrated circuit device of claim 1, further comprising:
    a first switching circuit connected between the target PMOS transistor, and a connection node of the target PMOS transistor and the target NMOS transistor.

4. The semiconductor integrated circuit device of claim 1, further comprising:
    an output node coupled between the target PMOS transistor and target NMOS transistor; and
    a first switching circuit coupled between the target PMOS transistor and the output node.

5. The semiconductor integrated circuit device of claim 1, further comprising:
    a second switching circuit coupled between a connection node of the target PMOS transistor and the target NMOS transistor, and the target NMOS transistor.

6. The semiconductor integrated circuit device of claim 1, further comprising:
    an output node coupled between the target PMOS transistor and target NMOS transistor; and a second switching circuit coupled between the target NMOS transistor and the output node.

7. The semiconductor integrated circuit device of claim 5, wherein the first stress-applying circuit is configured to output a ground voltage or an internal voltage.

8. The semiconductor integrated circuit device of claim 1, wherein the second stress-applying circuit is configured to output an external voltage and an internal voltage.

9. The semiconductor integrated circuit device of claim 1, further comprising:
a selecting circuit coupled to output nodes of the second stress-applying circuit and the third stress-applying circuit to provide any one of output signals from the second and third stress-applying circuits to the gate of the target NMOS transistor.

10. The semiconductor integrated circuit device of claim 1, wherein the third stress-applying circuit is configured to output a ring oscillator stress (ROS) in response to the target NMOS transistor selection signal.

11. The semiconductor integrated circuit device of claim 10, wherein the fourth stress-applying circuit is configured to apply the ROS to the drain of the target NMOS transistor in response to the target NMOS transistor selection signal.

12. The semiconductor integrated circuit device of claim 1, wherein the fourth stress-applying circuit comprises:
an AC voltage-applying circuit configured to output a ring oscillator stress (ROS) in response to the target NMOS transistor selection signal;
an AC-PMOS transistor configured to receive an output voltage of the AC voltage-applying circuit as a gate voltage and to form the target NMOS transistor and a quasi inverter; and
an AC-switching circuit connected between the AC-PMOS transistor and an output node of the quasi inverter to provide a signal transmitted from the AC-PMOS transistor to the output node of the quasi inverter in response to the target NMOS transistor selection signal.

13. The semiconductor integrated circuit device of claim 12, wherein the RC delay is coupled between a drain of the AC-PMOS transistor and the AC-switching circuit.

14. The semiconductor integrated circuit device of claim 13, wherein the RC delay comprises:
a resistor coupled to the drain of the AC-PMOS transistor; and
a variable capacitor coupled between the resistor and the AC-switching circuit.

15. A semiconductor integrated circuit device comprising:
a target NMOS transistor configured to test a degradation of the semiconductor integrated circuit device due to a stress;
a gate stress-applying circuit configured to selectively apply a direct current (DC) voltage having a first level, a DC voltage having a second level different from the first level and an alternate current (AC) voltage to a gate of the target NMOS transistor; and
an auxiliary stress-applying circuit configured to apply a voltage to a drain of the target NMOS transistor when the AC voltage is applied to the gate of the target NMOS transistor, the voltage having a waveform substantially the same as that of the AC voltage in response to a target NMOS transistor selection signal,
wherein the auxiliary stress-applying circuit includes a RC delay.

16. The semiconductor integrated circuit device of claim 15, wherein the auxiliary stress-applying circuit comprises:
an AC voltage-applying circuit configured to output a ring oscillator stress (ROS);
an AC-PMOS transistor configured to receive an output voltage of the AC voltage-applying circuit as a gate voltage and to form the target NMOS transistor and a quasi inverter; and
an AC-switching circuit coupled between the AC-PMOS transistor and an output node of the quasi inverter to provide a signal transmitted from the AC-PMOS transistor to the output node of the quasi inverter in response to a target NMOS transistor selection signal,
wherein the RC delay is coupled between a drain of the AC-PMOS transistor and the AC-switching circuit.

17. The semiconductor integrated circuit device of claim 16, wherein the RC delay comprises:
a resistor coupled to the drain of the AC-PMOS transistor; and
a capacitor coupled between the resistor and the AC-switching circuit.

18. The semiconductor integrated circuit device of claim 16, wherein the capacitor includes a variable resistor.

19. The semiconductor integrated circuit device of claim 16, wherein the degradation of the target NMOS transistor due to the stress is obtained from an oscillation signal from the AC voltage-applying circuit and a logic operation value of an output signal from the quasi inverter.

* * * * *